United States Patent [19]

Omino et al.

[11] Patent Number: 5,787,034

[45] Date of Patent: *Jul. 28, 1998

[54] NONVOLATILE SEMICONDUCTOR MEMORY HAVING A STRESS RELAXING VOLTAGE APPLIED TO ERASE GATE DURING DATA WRITE

[75] Inventors: Sachiko Omino, Kokubunji; Tadashi Miyakawa, Adachi-Ku; Masamichi Asano, Ota-Ku, all of Japan

[73] Assignee: Kabushiki Kaisha Toshiba, Kawasaki, Japan

[*] Notice: The term of this patent shall not extend beyond the expiration date of Pat. No. 5,636,160.

[21] Appl. No.: 813,951

[22] Filed: Mar. 3, 1997

Related U.S. Application Data

[62] Division of Ser. No. 570,575, Dec. 11, 1995, Pat. No. 5,636,160, which is a division of Ser. No. 913,908, Jul. 16, 1992, abandoned.

[30] Foreign Application Priority Data

Jul. 16, 1991 [JP] Japan .................. 3-201255

[51] Int. Cl.$^6$ .................................. G11C 16/06
[52] U.S. Cl. .................. 365/185.02; 365/185.14; 365/185.18; 365/185.23; 365/185.31
[58] Field of Search .............. 365/185.02, 185.14, 365/185.18, 185.23, 185.31

[56] References Cited

U.S. PATENT DOCUMENTS

| | | | |
|---|---|---|---|
| 4,466,081 | 8/1984 | Masuoka | 365/185.14 |
| 5,034,926 | 7/1991 | Taura et al. | 365/185.14 |
| 5,289,425 | 2/1994 | Horiguchi et al. | 365/226 |

FOREIGN PATENT DOCUMENTS

| | | | |
|---|---|---|---|
| 64-059698 | 3/1989 | Japan | G11C 17/00 |

OTHER PUBLICATIONS

Asano et al., English Translation of JP 64-059698, pp. 1–16 (1989).

*Primary Examiner*—Joseph A. Popek
*Assistant Examiner*—Andrew Q. Tran
*Attorney, Agent, or Firm*—Foley & Lardner

[57] ABSTRACT

A non-volatile semiconductor memory having: a memory cell array having non-volatile memory cells disposed in a matrix form, each memory cell having a floating gate, a control gate, an erase gate, a source and a drain, and data being written through injection of electrons into the floating gate and erased through removal of electrons from the floating gate; and a peripheral circuit driven by a high voltage power source and a low voltage power source, predetermined voltages being applied to the control gate, erase gate and drain respectively of each memory cell to enter one of a data write mode, data erase mode and data read mode, in the data write mode, high voltages being applied to the control gate and drain of the memory cell to be data-written, a stress relaxing voltage being applied to each erase gate of memory cells not to be data-written, and the stress relaxing voltage being an intermediate voltage between the voltages of the high and low power sources.

9 Claims, 8 Drawing Sheets

NONVOLATILE SEMICONDUCTOR MEMORY HAVING A STRESS RELAXING VOLTAGE APPLIED TO ERASE GATE DURING DATA WRITE

This application is a divisional of application Ser. No. 08/570,575, filed Dec. 11, 1995, now U.S. Pat. No. 5,636,160; which is a divisional of application Ser. No. 07/913,908, filed Jul. 16, 1992, now abandoned.

BACKGROUND OF THE INVENTION

1. Field of the Invention

The present invention relates to an electrically programmable non-volatile semiconductor memory with an improved reliability eliminating an erroneous operation of non-selected memory cells to be caused by voltage stress applied thereto.

2. Description of the Related Background Art

Data of an electrically erasable and programmable ROM (EEPROM) can be erased and programmed while it is being mounted on a circuit board. It is therefore easy to use as compared to an ultraviolet erase type EPROM. Demands for EEPROMs are rapidly increasing in the application to control memories, IC card memories and the like. As memory cells M for EEPROMs of a large capacity, three-layered polysilicon structure type non-volatile transistors are used each having a floating gate FG, a control gate CG and an erase gate EG like shown in FIG. 1. A number of such memory cells are disposed in a matrix form to constitute a memory cell array MA. In erasing data, a positive high voltage is applied to the erase gate EG to emit electrons stored in the floating gate FG toward the erase gate EG. In writing data, a high voltage is applied to the control gate CG and drain D of a selected memory cell M to inject electrons to the floating gate FG.

In writing data to EEPROM, it is conventional to set the erase gate to 0 V or $V_{CC}$. Therefore, a voltage stress of the floating gate of a non-selected memory cell becomes large. Namely, the electric field between the floating gate and the erase gate or channel of a non-selected memory cell becomes great, resulting in erroneous operations such as electron injection (write error) from the erase gate or substrate to the floating gate, and electron emission (erase error) from the floating gate to the erase gate.

The voltage stress of a non-selected memory cell will be described in detail with reference to the cell pattern layout and equivalent circuit.

FIG. 2A is a plan view showing a memory cell pattern, FIG. 2B is a cross section taken along line A-A' of FIG. 2A, and FIG. 2C is a cross section taken along lien B-B' of FIG. 2A. In FIGS. 2A to 2C, reference numeral 11 represents a floating gate of a first polysilicon layer, reference numeral 12 represents an erase gate of a second polysilicon layer, and reference numeral 13 represents a control gate of a third polysilicon layer. The control gate 13 is used also as a memory cell word line. Reference numeral 14 represents a p-type substrate, reference numerals 15 and 16 represent a source and drain formed by $n^+$ type diffusion layers on the substrate 14, and reference numeral 17 represents a contact hole. Reference numeral 18 represents a data line of an aluminum layer connected to the drain 16 via the contact hole 17. Reference numeral 19 represents a gate insulating film for the floating gate transistor portion, reference numeral 20 represents a gate insulating film between the floating gate 11 and erase gate 12, and reference numeral 21 represents a gate insulating film between the floating gate 11 and control gate 13. The gate insulating film 21 is made of a three-layered film of an oxide-nitride-oxide (O—N—O) structure. Reference numeral 22 represents a gate insulating film between the erase gate 12 and control gate 13, which has also the O—N—O structure. Reference numeral 23 represents an insulating film for the control gate transistor portion made of the third polysilicon layer. Reference numeral 24 represents a field insulating film, and reference numeral 25 represents an interlayer insulating film.

The fundamental operation of a memory cell having such a structure will be described next. As seen from FIG. 1, in writing data, a high voltage, e.g., +8 V, is applied to the drain 16, 0 V is applied to the source 15, a positive high voltage, e.g., 12 V, is applied to the control gate 13, and a power source voltage, e.g., 5 V, is applied to the erase gate 12. In this state, the hot electron effect occurs near the drain so that electrons generated by impact ionization are injected into the floating gate 11 to charge it negative. As a result, the threshold voltage of the memory cell rises. This condition is assumed as data "0".

In erasing data "0" written in a memory cell by injecting electrons in the floating gate 11, 0 V is applied to the source 15, drain 16 and control gate 13, and a positive high voltage, e.g., +21 V, is applied to the erase gate 12. In this state, the Fowler-Nordeheim tunneling effect occurs so that electrons in the floating gate are emitted out to the erase gate to charge the floating gate positive. As a result, the threshold voltage of the memory cell lowers. This condition is assumed as data "1".

The equivalent circuit of the memory cell shown in FIGS. 2A to 2C is shown in FIG. 3, and the capacitive equivalent circuit is shown in FIG. 4. In FIG. 3, $V_D$ represents a drain voltage, $V_S$ represents a source voltage, $V_{FG}$ represents a floating gate voltage, $V_{EG}$ represents an erase voltage, and $V_{CG}$ represents a control gate voltage. In FIG. 4, $C_{FC}$ represents a capacitance between the floating gate 11 and control gate 13, $C_{FE}$ represents a capacitance between the floating gate 11 and erase gate 12, $C_{FD}$ represents a capacitance between the floating gate 11 and drain 15, and $C_{FS}$ represents another capacitance as viewed from the floating gate 11.

Such memory cells are disposed in a matrix form. For the simplicity of description, a memory cell array MA having four bit memory cells M(A) to M(D) shown in the circuit of FIG. 1 are used illustratively. Drains D of the four memory cells M are connected to two data lines DL1 and DL2, control gates CG are connected to two word lines WL1 and WL2, and erase gates EG of all the memory cells M are connected in common to an erase line EL. A reference voltage, e.g., 0 V, is applied to the source S.

In the memory cell array MA constructed as above, data write to a selected memory cell will be described. Consider the case where data "0" is written to a memory cell M(A) for example. A high voltage +8 V is applied to the data line DL1, and a high voltage +12 V is applied to the word line WL1. The other data line DL2 and word line WL2 are applied with 0 V. In this state, the memory cells M(B) to M(D) are not selected and so not written. A voltage, 0 V or higher, is being applied to the drains, control gates and erase gates of the non-selected memory cells M(B) to M(D). As a result, a voltage stress is applied to the floating gates of non-selected memory cells M(B) to M(D). This voltage stress can be calculated in the following manner.

The initial value Q(I) of electric charge stored in all the capacitors shown in FIG. 4 is given by the following expression (1):

$$Q(I) = (V_{FG} - V_{CG})*C_{FC} + (V_{FG} - V_{EG})*C_{FE} + (V_{FG} - V_D)*C_{FD} + (V_{FG} - V_S)*C_{FS} \quad (1)$$

The total capacitance $C_T$ of all the capacitors shown in FIG. 4 is given by the following expression (2):

$$C_T = C_{FC} + C_{FE} + C_{FD} + C_{FS} \quad (2)$$

Therefore, the voltage $V_{FG}$ at the floating gate is given by:

$$V_{FG} \{ (V_{CG}*C_{FC} + V_{EG}*C_{FE} + V_D*C_{FD} + V_S*C_{FS})/C_T \} + [Q(I)/C_T] \quad (3)$$

By substituting $Q(I)/C_T = V_{FG}(I)$ and $V_S = 0$ V, the expression (3) is rewritten by:

$$V_{FG} = \{(V_{CG}*C_{FC} + V_{EG}*C_{FE} + V_D*C_{FD})/C_T\} + V_{FG}(I) \quad (4)$$

The value of each capacitor is given by:

$$C_{FC} = (\epsilon_{ox}*S_C)/t_{ox1} \quad (5)$$

$$C_{FE} = (\epsilon_{ox}*S_E)/t_{ox2} \quad (6)$$

$$C_{FD} = (\epsilon_{ox}*S_D)/t_{ox3} \quad (7)$$

$$C_{FS} = \{(\epsilon_{ox}*S_S)/t_{ox3}\} + \{(\epsilon_{ox}*S_F)/t_{ox4}\} \quad (8)$$

where $S_C$ represents an interfacing area between the floating gate 11 and control gate 13, $t_{ox1}$ represents a thickness of the insulating film 21 therebetween, $S_E$ represents an interfacing area between the floating gate 11 and erase gate 12, $t_{ox2}$ represents a thickness of the insulating film 20 therebetween, $S_D$ represents an interfacing area between the floating gate 11 and drain 16, $t_{ox3}$ represents a thickness of the insulating film 19 therebetween, $S_S$ represents an interfacing area between the floating gate 11, and source 15 and channel, $S_F$ represents an interfacing area between the floating gate 11 and field insulating film 24, $t_{ox4}$ represents a thickness of the field insulating film 24, and $\epsilon_{ox}$ represents a dielectric constant of the insulating film.

It is assumed that the memory cell shown in FIGS. 2A to 2C has the following parameters. Namely, for the insulating films, $t_{ox1} = 680$ angstroms, $t_{ox2} = 370$ angstroms, $t_{ox3} = 280$ angstroms, and $t_{ox4} = 8000$ angstroms. For the areas, $S_C = 1.4$ mm$^2$, $S_E = 0.42$ mm$^2$, $S_D = 0.3$ mm$^2$, $S_S = 0.4$ mm$^2$, and $S_F = 1.12$ mm$^2$. The depth of the diffusion layer is $x_j = 0.3$ μm.

An erroneous operation of the non-selected memory cells M(B) to M(D) during the data write operation will be described in detail with reference to Tables 1 and 2 with $V_{EG}$ being set to 0 V and 5 V respectively. Given in Tables 1 and 2 are the gate voltages and the voltage stresses of the floating gates calculated by the above expressions of the equivalent circuit.

TABLE 1

(EG = 5 V)

| Memory cell | | $V_{CG}$ | $V_{BG}$ | $V_D$ | $V_S$ | $V_{FG}$ | Potential difference $V_{BG}-V_{FG}$ at FG-EG | Potential difference $V_S-V_{FG}$ at FG-source |
|---|---|---|---|---|---|---|---|---|
| A | "1" | 12 | 5 | 8 | 0 | 9.68 | −4.68 | −9.68 |
|   | "0" |    |   |   |   | 3.68 | 1.32 | −3.68 |
| B | "1" | 12 | 5 | 0 | 0 | 8.21 | 3.21 | −8.21 |
|   | "0" |    |   |   |   | 2.91 | 2.79 | −2.91 |
| C | "1" | 0 | 5 | 8 | 0 | 5.44 | −0.44 | (C)−5.44 |
|   | "0" |   |   |   |   | −0.56 | 5.56 | 0.56 |

TABLE 1-continued (EG = 5 V)

| Memory cell | | $V_{CG}$ | $V_{BG}$ | $V_D$ | $V_S$ | $V_{FG}$ | Potential difference $V_{BG}-V_{FG}$ at FG-EG | Potential difference $V_S-V_{FG}$ at FG-source |
|---|---|---|---|---|---|---|---|---|
| D | "1" | 0 | 5 | 0 | 0 | 3.97 | 1.03 | −3.97 |
|   | "0" |   |   |   |   | −2.03 | (D)7.03 | 2.03 |

TABLE 2

(EG = 0 V)

| Memory cell | | $V_{CG}$ | $V_{BG}$ | $V_D$ | $V_S$ | $V_{FG}$ | Potential difference $V_{BG}-V_{FG}$ at FG-EG | Potential difference $V_S-V_{FG}$ at FG-source |
|---|---|---|---|---|---|---|---|---|
| A | "1" | 12 | 0 | 8 | 0 | 8.71 | −8.71 | −8.71 |
|   | "0" |    |   |   |   | 2.71 | −2.71 | −2.71 |
| B | "1" | 12 | 0 | 0 | 0 | 7.24 | (B)−7.24 | −7.24 |
|   | "0" |    |   |   |   | 1.24 | −1.24 | −1.24 |
| C | "1" | 0 | 0 | 8 | 0 | 4.47 | −4.47 | −4.47 |
|   | "0" |   |   |   |   | −1.53 | 1.53 | 1.53 |
| D | "1" | 0 | 0 | 0 | 0 | 3 | −3 | −3 |
|   | "0" |   |   |   |   | −3 | 3 | 3 |

In the non-selected memory cell M(B) of the "1" state, a potential difference ($V_{EG}-V_{FG}$) of −7.24 V appears between the erase gate and floating gate when the erase gate voltage is low (e.g., $V_{EG}=0$ V). During data erase, a voltage +10.3 V is applied to the erase gate of the selected memory cell M(A) as viewed from the floating gate. In other words, the non-selected memory cell M(B) is applied with a voltage, opposite in polarity to, and approximately in the order of, the voltage used during the data erase for the selected memory cell. As a result, electrons are injected from the erase gate to the floating gate by the tunneling effect, resulting in a possible write error.

In the non-selected memory cell M(C) of the "1" state, a potential difference ($V_S-V_{FG}$) or −5.44 V appears between the source and the floating gate when the erase gate voltage is high (e.g., $V_{EG}=5.0$ V), also resulting in a possible write error.

The occurrence rate of write errors is high for memory cells near the selected memory cell M(A). The reason for this will be detailed below.

During data write to the selected memory cell M(A), electrons are accelerated in the region near the drain by the electric field concentrated onto this region, thereby generating high energy electron-hole pairs. The generated holes raise the substrate potential near the memory cell M(A), and therefore lower the threshold voltages $V_{th}$ of memory cells near the selected memory cell M(A) (e.g., the next memory cell M(C) on the same data line). Therefore, a small cell current will flow, and electrons are injected into the floating gate by the electric field between the substrate and floating gate as described above, resulting in a write error. Of memory cells taking the same condition as the memory cell M(C) ($V_{EG}=5.0$ V, $V_{CG}=0$ V, $V_D=8$ V, $V_S=0$ V, "1" state), the nearer the memory cells to the selected memory cell, the more they are likely to be subject to write errors.

In the non-selected memory cell M(D) of the "0" state, a potential difference ($V_{EG}-V_{FG}$) of 7.03 V appears between the erase gate and floating gate when the erase gate voltage is high (e.g., $V_{EG}=5$ V). With this potential difference, electrons are emitted from the floating gate to the erase gate, resulting in a possible erase error.

In Tables 1 and 2, the potential difference (B) indicates a $V_{EG}$ stress causing a write error of the memory cell M(B), the potential difference (C) indicates a $V_{EG}$ stress causing a write error of the memory cell M(C), and the potential difference (D) indicates a $V_{EG}$ stress causing an erase error of the memory cell M(D).

In the above-described memory cell array, it is conventional to set the erase gate voltage to $V_{EG}=V_{CC}=5.0$ V. In such a case, as described previously, a write error may occur in the memory cell M(C) and an erase error may occur in the memory cell M(D). The conventional erase electrode voltage has been determined depending upon $V_{CC}$. If $V_{CC}$ takes a higher voltage than 5.0 V, the write error and erase error of the memory cells M(C) and M(D) will become more likely to occur. For example, in programming by using a ROM writer, the EP compatible mode uses $V_{CC}=6.0$ to 6.5 V, and the on-board command mode uses $V_{CC}=4.5$ to 5.5 V. In such a case, in the memory cell M(D) of the "0" state, a voltage stress or potential difference between the floating gate and erase gate has a difference of 1.6 V at the maximum. On the other hand, if $V_{EG}$ is set to 0 V, the write error and erase error of the memory cells M(C) and M(D) are suppressed. However, as described above, in the memory cell M(B), the voltage at the floating gate becomes higher than that at the erase gate, resulting in a possible write error.

As described above, the erase voltage has been determined depending upon $V_{CC}$ so that the voltage stress changes with $V_{CC}$. Therefore, it is difficult to optimize designs and processes allowing the improvement of memory cell reliability.

As stated above, a memory using as memory cells non-volatile transistors having a floating gate, has been associated with erroneous operations of non-selected memory cells to be caused by a voltage stress applied to floating gates.

SUMMARY OF THE INVENTION

The present invention has been made under the above-described circumstances. It is therefore an object of the present invention to provide a non-volatile semiconductor memory with an improved reliability eliminating an erroneous operation of non-selected memory cells to be caused by applied voltage stress during a write operation.

During data write (during programming), a voltage with a range of $0<V_{EG}<V_{CC}$ independent from the power source voltage ($V_{CC}$) is applied to the erase gates of memory cells, to lower a potential difference between the erase gate and floating gate and between the floating gate and source. Electron injection from the erase gate or channel (substrate) to floating gate or electron emission from the floating gate to erase gate is therefore suppressed in each non-selected memory cell during data write or programming, preventing erroneous operations of non-selected memory cells.

According to the present invention, a voltage applied to the erase gates of non-selected cells during data write is set to a value sufficient for reducing a voltage stress. Therefore, it is possible to provide a non-volatile semiconductor memory with an improved reliability eliminating an erroneous operation of non-selected memory cells to be caused by voltage stress.

DESCRIPTION OF THE PREFERRED EMBODIMENTS

Figure 7:
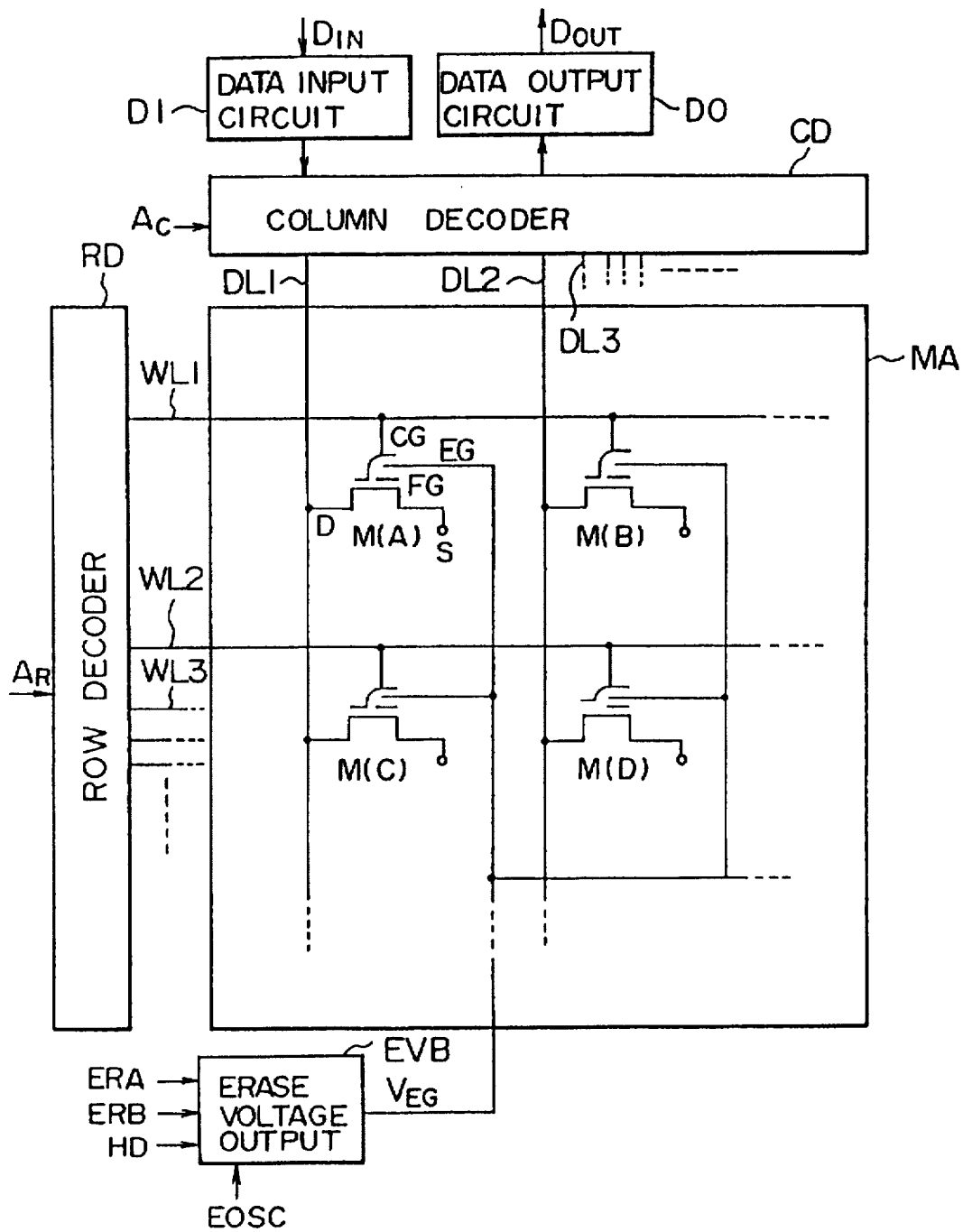
FIG. 7 is a schematic diagram showing the overall structure of a non-volatile semiconductor memory according to an embodiment of the present invention.

FIG. 7 is a schematic diagram showing the overall structure of a non-volatile semiconductor memory of the present invention.

Figure 1:
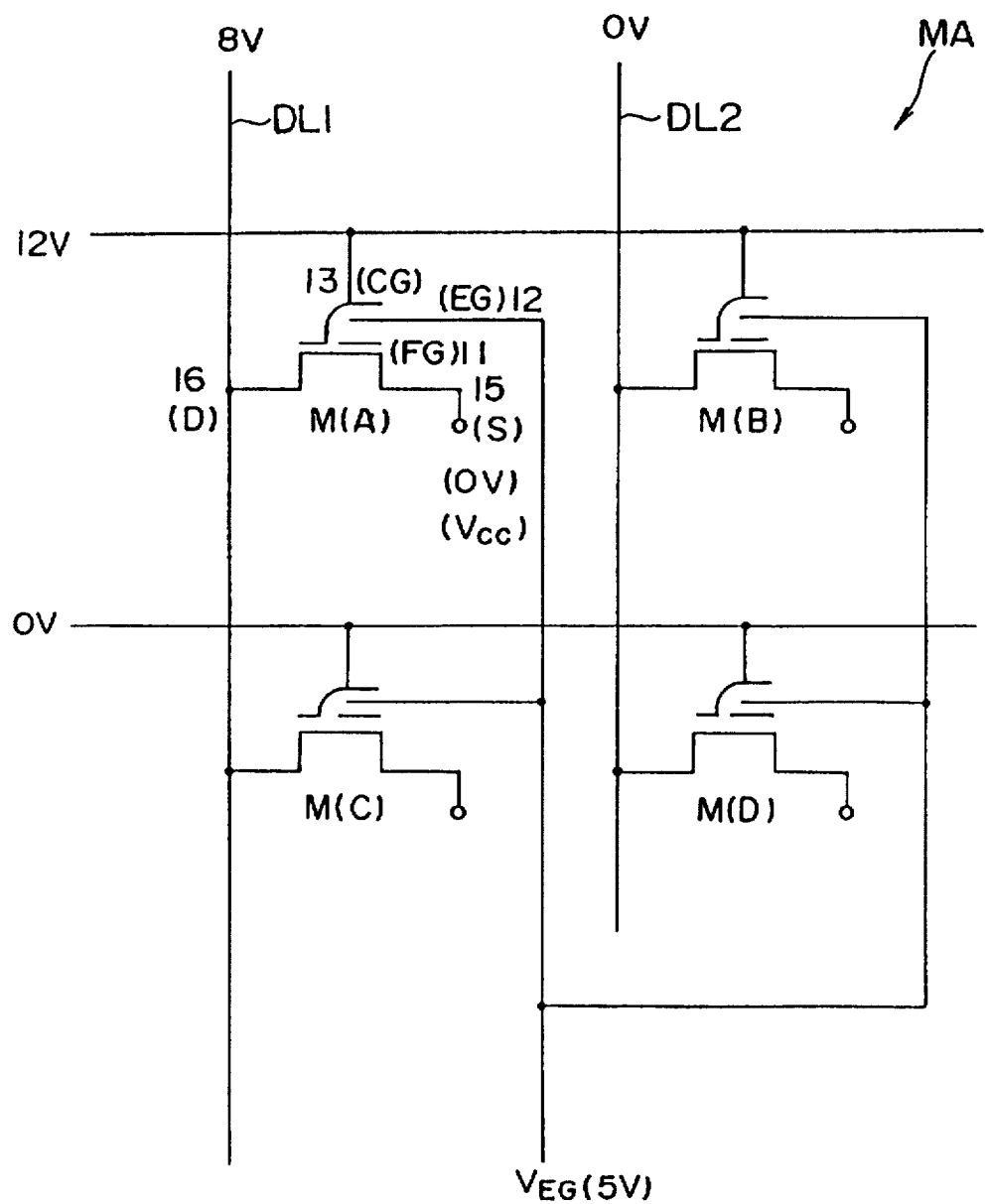
FIG. 1 shows an example of a layout of memory cells.
Figure 2A:
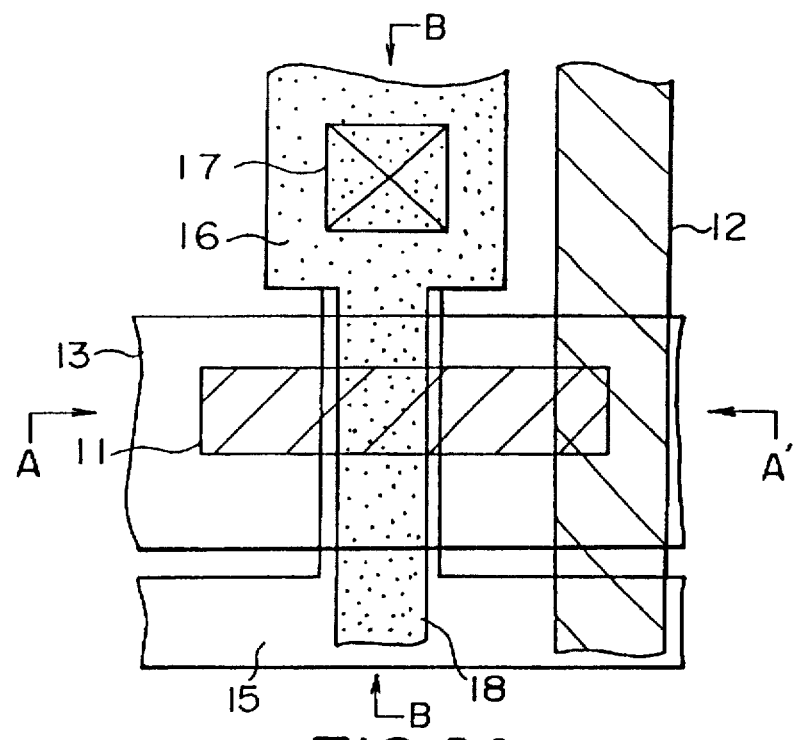
FIGS. 2A to 2C are a plan view, cross section taken along line A-A' of FIG. 2A, and cross section taken along line B-B' of FIG. 2A, respectively of a memory cell.
Figure 2B:
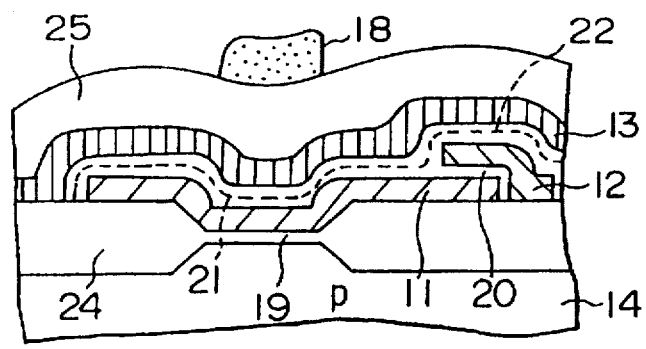
Figure 2C:
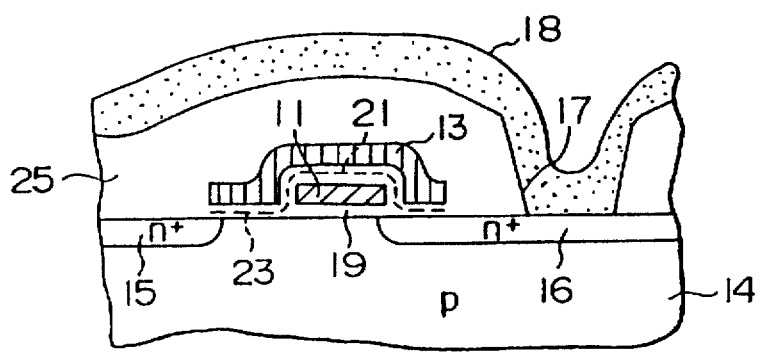
Figure 3:
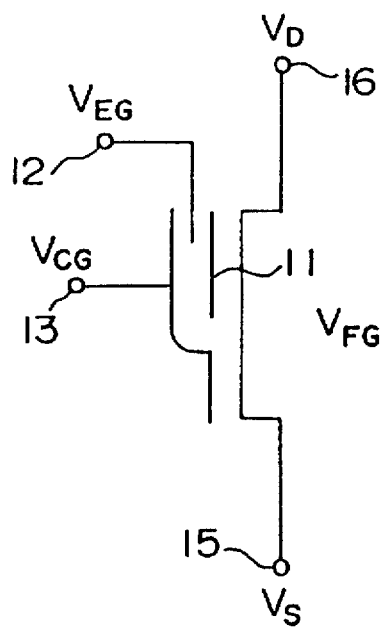
FIG. 3 is an equivalent circuit diagram of the memory cell shown in FIGS. 2A to 2C.
Figure 4:
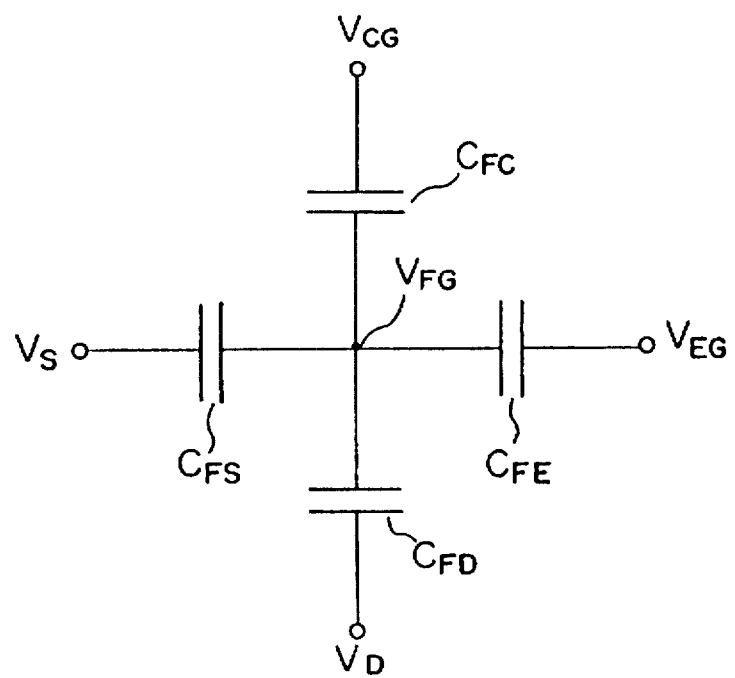
FIG. 4 is a capacitive equivalent circuit of the memory cell shown in FIGS. 2A to 2C.

A memory cell array MA has a plurality of memory cells (transistors) M. In FIG. 7, only four memory cells M(A) to M(D) are shown. Each memory cell M has a drain D, source S, floating gate FG, erase gate EG, and control gate CG, and operates in the manner described with FIG. 1. Word lines WL connected to the memory cell array MA are selected by a row decoder RD. Namely, a row address $A_R$ is decoded by the row decoder RD to select one of the word lines WL. Similarly, one of data lines DL is selected by a column address $A_C$ decoded by a column decoder CD. In the programming mode, a write data $D_{in}$ is transferred via a data input circuit DI to the selected data line DL. In the data read mode, data read onto the data line DL is outputted from a data output circuit DO as an output data $D_{out}$. In the data erase mode, an erase voltage $V_{EG}$ from an erase voltage output circuit EVB is supplied to the erase gate EG of each cell M to erase all data in a flash manner.

More specifically, supplied to the erase voltage output circuit EVB are an address decoder signal ERA, a program/erase state signal HD, and an erase state signal EOSC. Being supplied with these signals, the erase voltage output circuit EVB outputs a high voltage (e.g., 21 V) during the data erase mode, a low voltage (e.g., 0 V) during the data read/standby mode, and a voltage (e.g., 3 V or 2 V) between 0 V and the power source voltage $V_{CC}$ (e.g., 5 V) during the data programming mode.

Figure 8:
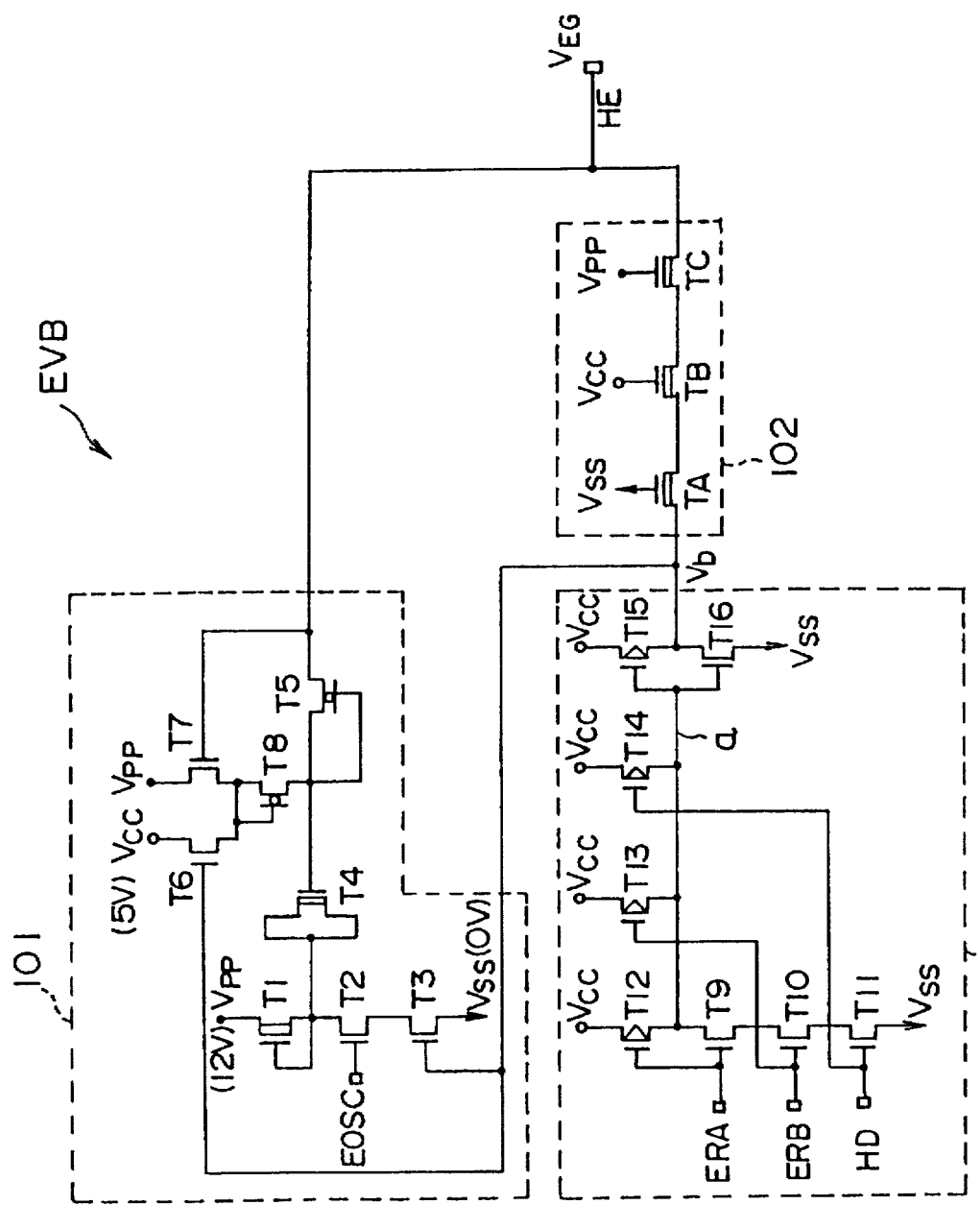
FIG. 8 is a circuit diagram showing a first example of the erase voltage output circuit shown in FIG. 7.
Figure 9:
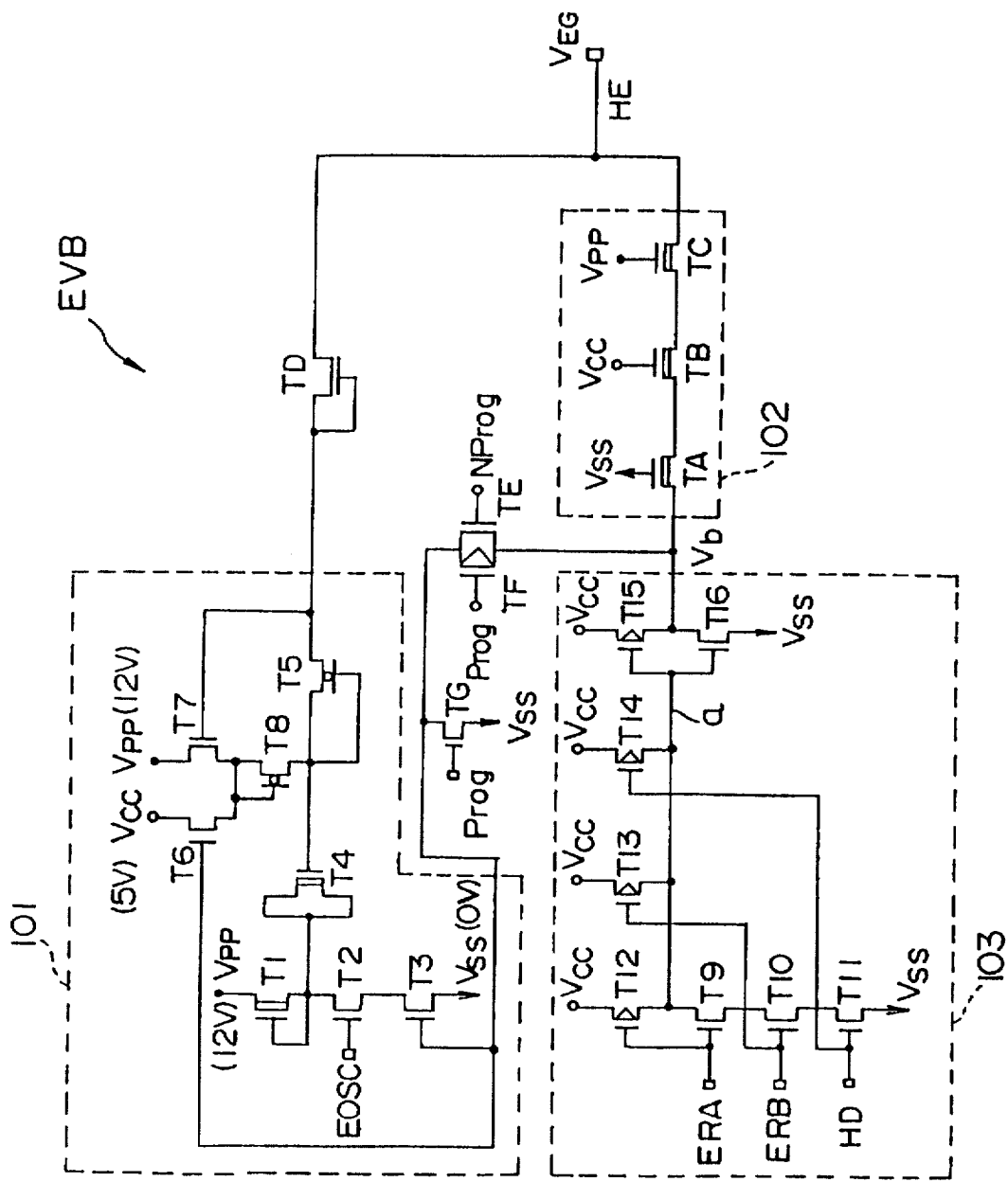
FIG. 9 is a circuit diagram showing a second example of the erase voltage output circuit shown in FIG. 7.
Figure 10:
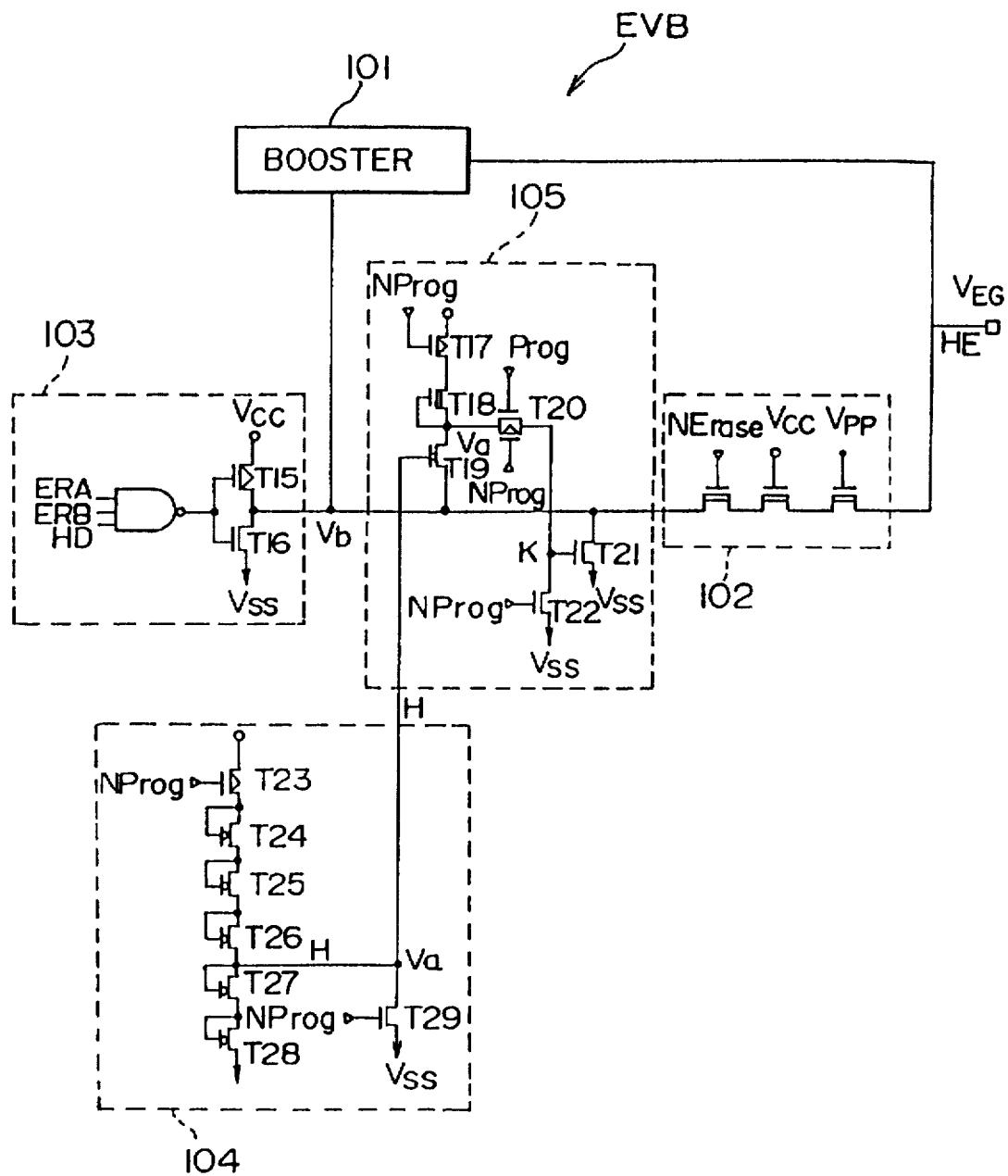
FIG. 10 is a circuit diagram showing a third example of the erase voltage output circuit shown in FIG. 7.

FIGS. 8 to 10 are circuit diagrams showing different embodiments of the erase voltage output circuit EVB shown in FIG. 7 operating in the manner described above. The circuits shown in FIGS. 8 to 10 will be described in the order as recited.

Referring first to FIG. 8, this output circuit EVB includes a voltage booster circuit 101, a voltage buffer circuit 102, and a block decoder 103. The voltage booster circuit 101 has N-channel transistors T1 to T8. The transistors T1 and T4 are of a D-type ($V_{th}<0$ V), the transistors T2, T3, T6 and T7 are of an E-type ($V_{th}>0$ V), and the transistors T5 and T6 are of an I-type ($V_{th}$ is nearly 0 V). The voltage buffer circuit 102 has N-channel, D-type transistors TA, TB and TC. The block decoder 103 has transistors T9 to T16, the transistors T9 to T11 and T16 being N-channel and E-type, and the transistors T12 to T15 being P-channel.

In the voltage booster circuit 101, the signal EOSC is an oscillating signal $0-V_{CC}$ during the data erase mode, and is a signal of 0 V during the other modes. The signals ERA and ERB are a block decoder signal. The signal HD takes "1" level during the programming and erase modes and takes "0" level during the other modes.

In the circuit shown in FIG. 8, during the programming mode, the output voltage $V_{EG}$ is set to the threshold value $|V_{th}|$ of the D-type transistor TA with its gate being applied with $V_{SS}$.

Input and output signals of the circuit shown in FIG. 8 during each mode are given in Table 3 which stands for a block selected by the signals ERA="1" and ERB="1" inputted to the block decoder 103. As seen from Table 3, in the programming mode the voltage booster circuit 101 is turning off because of EOSC="L". Therefore, the output terminal HE is not charged from the voltage booster circuit C. However, since HD="H", $V_{CC}$ is supplied from the block decoder 103. At this time, the D-type transistor TA with $V_{SS}$ being applied to its gate turns on. Also, the D-type transistors TB and TC turn on. As a result, the output $V_{EG}$ takes the threshold voltage $|V_{th}|$ of the D-type transistor TA. In this manner, the voltage $V_{EG}$ to be inputted to the erase gates of memory cells becomes independent from the power source voltage $V_{CC}$. In the data erase mode, EOSC enters the oscillation state "1" and the output of the block decoder 103 is "1". Therefore, the voltage booster circuit 101 operates to deliver the output $V_{EG}$ of 21 V. In this case, the voltage 21 V is stepwise lowered by the voltage buffer transistors TA through TC so as not to apply a high voltage to the block decoder 103. In the data read and standby modes, discharge occurs from the output terminal HE to the transistor T16 because of HD="L" to supply the output voltage $V_{EG}$=0 V. In this case the voltage booster circuit 101 is being turned off because of EOSC="0".

TABLE 3

(FIG. 8)

| Mode | REB | HD | Booster | Node a | Node $V_b$ | Output $V_{EG}$ |
|------|-----|-----|---------|--------|------------|-----------------|
| Program | L | H | OFF | L | H | 3 V |
| Erase | L | H | ON | L | H | 21 V |
| Read | L | L | OFF | H | L | 0 V |
| Standby | L | L | OFF | H | L | 0 V |

TABLE 4

| Mode | NErase | HD | NProg | Booster | $V_b$ | Output $V_{EG}$ |
|------|--------|-----|-------|---------|-------|-----------------|
| Program | H | H | L | OFF | 2 V | 2 V |
| Erase | L | H | H | ON | 5 V | 21 V |
| Read | H | L | H | OFF | 0 V | 0 V |
| Standby | H | L | H | OFF | 0 V | 0 V |

In the circuit shown in FIG. 8, in the programming mode, the output voltage $V_{EG}$ is charged from the transistor T15 of the block decoder 103. However, the output terminal HE may be set to an optional voltage, and is connected to the gate of the transistor T7 which is supplied with $V_{PP}$=12 V. Therefore, charge from the voltage booster circuit may occur. The voltage at the output terminal HE is therefore a sum of both charges. If $V_{CC}$ is considerably higher than 5.5 V, there occurs a $V_{CC}$ dependency. However, if $V_{CC}$ is within a range from 4.5 V to 6.5 V, the $V_{CC}$ dependency is small, and no problem occurs within the practical use range of $V_{CC}$±10%.

Figure 5:
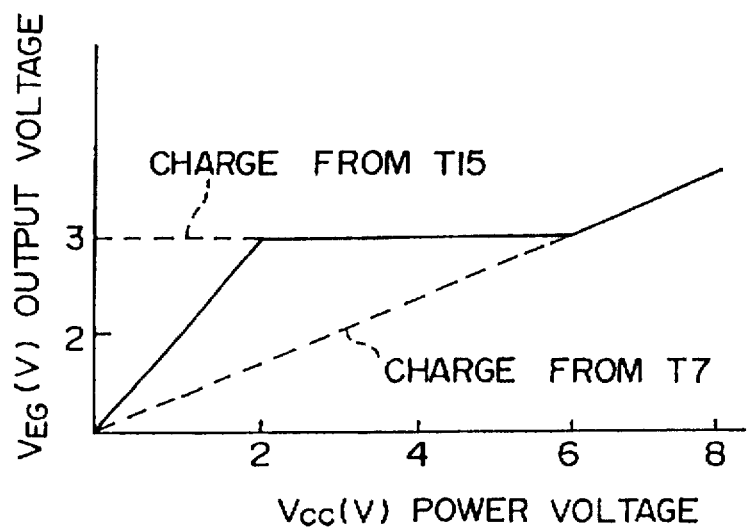
FIG. 5 is a graph showing the output characteristics of the circuit shown in FIG. 8.

FIG. 5 shows the output characteristics of the circuit shown in FIG. 8.

Next, the circuit shown in FIG. 9 will be described.

Different points of the circuit shown in FIG. 9 from the circuit shown in FIG. 9 are the addition of an E-type transistor TD to the charge path from the voltage booster circuit 101 and the addition of E-type transistors TE, TF and TG at the path of the block decoder 103 to the voltage booster circuit 101. The transistors TE and TG are of an N-channel and applied with an L/H level signals NProg/Prog in the programming mode. The transistor TF is of a P-channel and applied with an H level signal Prog in the programming mode.

The addition of these E-type transistors TD to TG prevents current from flowing from the output terminal He to the voltage booster circuit 101. Therefore, an optional output voltage $V_{EG}$ cannot be applied to the gate of the transistor 7. In other words, there is no charge from the voltage booster circuit 101. In the data erase mode, the level at the output terminal HE lowers by the threshold value $V_{th}$ of the transistor TD to ($V_{EG}=V_g-V_{th}$) which is about 19 V.

Figure 6:
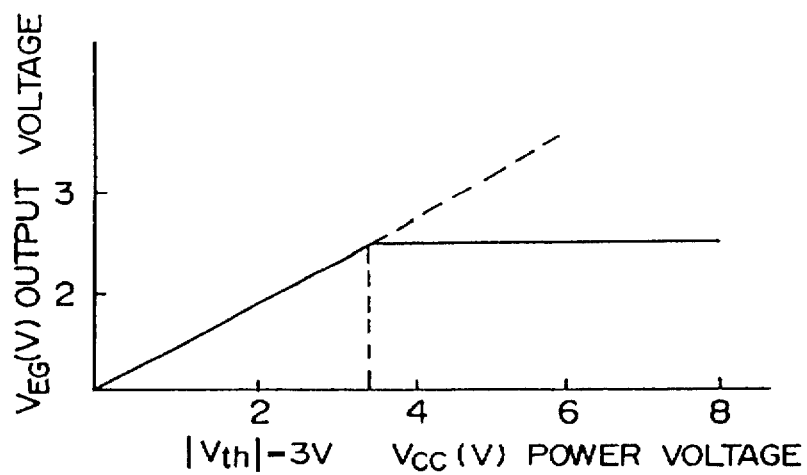
FIG. 6 is a graph showing the output characteristics of the circuit shown in FIG. 9.

In the circuit shown in FIG. 9, the erase gate voltage in the programming mode is determined by the threshold voltage $V_{th}$ of the transistor TA. This erase voltage is set to a voltage entirely free from the $V_{CC}$ dependency when the power source voltage $V_{CC}$ exceeds $V_{th}$. FIG. 6 shows the output characteristics of the circuit shown in FIG. 9.

Next, the circuit shown in FIG. 10 will be described. In addition to the voltage booster circuit 101, voltage buffer circuit 102 and block decoder 103 like those shown in FIGS. 8 and 9, a constant voltage circuit 104 and feedback circuit 105 are provided to the circuit shown in FIG. 10.

The operation of the circuit of FIG. 10 in each mode will be described.

In the programming mode, EOSC="L" so that the voltage booster circuit 101 turns off. While the block decoder operates to select a block, the node $V_b$ is charged by the transistor T15. At the same time, the constant voltage circuit 104 and feedback circuit 105 operate to set a voltage within a range of 0<$V_b$<$V_{CC}$ to the node $V_b$ or output terminal HE. The output H of the constant voltage circuit 104 is set to a voltage determined by a voltage division ratio of I-type transistors T24 to T28. The output E is inputted to the gate of an I-type transistor T19. The signal NProg takes the "L" level in the programming mode. Therefore, a transfer gate T20 turns on, the gate T20 being constructed of P- and N-channel two transistors connected in parallel. A node K therefore takes a potential determined by a voltage division ratio of transistors T17, T18, T19 and T21. This voltage at the node K is inputted to the gate of the transistor T21. The transistor T18 has a small conductance gm. If a potential at the node $V_b$ is low, the node K will not be charged. As a result, the discharge transistor T21 turns off, and the node $V_b$ is charged from the transistor T15. In this case, although the I-type transistor T19 is turning on, charge from the transistor T17 is small because the transistor T18 has a small conductance gm. As the charge from the transistor T15 proceeds, the voltage $V_b$ rises. When the voltage $V_b$ reaches $V_b=V_a-V_{th19}$, the I-type transistor T19 turns off and the node K is charged from the D type transistor T18. Namely, the output terminal HE and node $V_b$ are set to voltage values determined by a balanced combination of charge by the transistor T15, charge by the transistors T17, T18 and T19, and discharge by the transistor T21.

In the data erase mode, the voltage booster circuit 101 turns on and so the output terminal He is set to 21 V. Since the signal HD="H", the node $V_b$ is charged to 5 V from the transistor T15 of the block decoder 103. If the transfer gate T20 is not provided, a leak current flows from the node $V_b$=5 V to the transistors T19 and T21. Therefore the voltage at the node $V_b$ lowers and the voltage booster circuit 101 will not operate normally. However, in this embodiment, the transfer gate T20 is provided to suppress such a leak current and prevent an erroneous operation. In the data read and standby modes, the constant voltage circuit 104 and feedback circuit 105 both turn off because of NProg="H". The voltage booster circuit 101 also turns off. In this condition, the transistor T16 turns on and the output terminal HE is set to 0 V.

In the circuit shown in FIG. 10, the voltage at the output terminal HE is regulated by the feedback circuit configuration, eliminating a variation of the voltage at the output terminal HE to be caused by different threshold values $V_{th}$ of transistors resulting from different process parameters. By making it possible to take an optional value of the voltage at the output node H of the constant voltage circuit 104, the voltage at the output terminal can be adjusted finely and a stable output terminal HE voltage can be obtained.

Tables 5 and 6 show voltage stresses when $V_{EG}$ is set to 2 V and 3 V in the circuit shown in FIGS. 8 to 10. Table 7 show large voltage stresses when $V_{EG}$ are set to 0, 5, 2 and 3 V for the comparison therebetween. It can be seen from Table 7 that voltage stresses are reduced for all types of non-selected memory cells when $V_{EG}$ is set to 2 V.

TABLE 5

($V_{EG}$ = 2 V)

| Memory cell | | $V_{CG}$ | $V_{BG}$ | $V_D$ | $V_S$ | $V_{FG}$ | Potential difference (V) at FG-EG | Potential difference (V) at FG-source |
|---|---|---|---|---|---|---|---|---|
| A | "1" | 12 | 2 | 8 | 0 | 8.10 | −6.10 | −8.10 |
|   | "0" |   |   |   |   | 4.10 | −2.10 | −4.10 |
| B | "1" | 12 | 2 | 0 | 0 | 6.63 | −4.63(B") | −6.63 |
|   | "0" |   |   |   |   | 2.63 | −0.63 | −2.63 |
| C | "1" | 0 | 2 | 8 | 0 | 3.86 | −1.86 | −3.86(C") |
|   | "0" |   |   |   |   | −0.04 | 2.04 | 0.04 |
| D | "1" | 0 | 2 | 0 | 0 | 2.39 | −0.39 | −2.39 |
|   | "0" |   |   |   |   | −1.61 | 3.61(D") | 1.61 |

TABLE 6

($V_{EG}$ = 3 V)

| Memory cell | | $V_{CG}$ | $V_{BG}$ | $V_D$ | $V_S$ | $V_{FG}$ | Potential difference $V_{EG}$−$V_{FG}$ at FG-EG | Potential difference $V_S$−$V_{FG}$ at FG-source |
|---|---|---|---|---|---|---|---|---|
| A | "1" | 12 | 3 | 8 | 0 | 9.29 | −6.29 | −9.29 |
|   | "0" |   |   |   |   | 3.29 | −0.29 | −3.29 |
| B | "1" | 12 | 3 | 0 | 0 | 7.82 | −4.82(B') | −7.82 |
|   | "0" |   |   |   |   | 1.82 | 1.18 | −1.82 |
| C | "1" | 0 | 3 | 8 | 0 | 5.05 | −2.05 | −5.05(C') |
|   | "0" |   |   |   |   | −1.05 | 4.05 | 1.05 |
| D | "1" | 0 | 3 | 0 | 0 | 3.58 | −0.58 | −3.58 |
|   | "0" |   |   |   |   | −2.42 | 5.42(D') | 2.42 |

TABLE 7

| Memory cell | | $V_{EG}$ = 0 (V) | 5 | 2 | 3 |
|---|---|---|---|---|---|
| B | "1" | (B)−7.24 (write error) |  | −4.6(B") | −4.82(B') |
| C | "1" |  | (c)−5.44 (write error) | −3.86(C") | −5.05(C') |
| D | "0" |  | (D) 7.03 (erase error) | 3.61(D") | 5.42(D') |

Specifically, the voltage stress at the floating gate FG of the memory cell M(B) shown in FIG. 7 was −7.24 V at $V_{EG}$=0 V. This voltage stress lowered to −4.63 V at $V_{EG}$=2 V. The electric field between the floating gate and erase gate is given by the expression E=($V_{EG}$−$V_{FG}$)/$t_{ox2}$. Using this expression, E=7.24/370 angstroms=1.96 (MV/cm) at $V_{EG}$=0 V. At $V_{EG}$=2 V, E=4.63/370 angstroms=1.25 (MV/cm). Similarly, the voltage stress at the floating gate of the memory cell M(C) was −5.44 V at $V_{EG}$=5.0 V. This voltage stress lowered to −3.86 V at $V_{EG}$=2 V. The corresponding electric fields were 1.94 (MV/cm) and 1.38 (MV/cm), respectively. The voltage stress of the memory cell M(D) which might cause an erase error was 7.03 V at $V_{EG}$=5 V, whereas at $V_{EG}$=2 V it was suppressed to 3.61 V. Namely, each stress voltage was approximately halved and each corresponding electric field was reduced about 30 to 50%. As appreciated, the voltage stress of a non-selected memory cell can be reduced in the data write mode by applying to the erase gate a positive voltage lower than $V_{CC}$, e.g., 2 V, and independent from $V_{CC}$, thereby greatly suppressing data write and erase errors of non-selected memory cells, and therefore considerably improving the reliability of memories.

It is also seen from Table 7 that a voltage stress can be suppressed at $V_{EG}$ more than at $V_{EG}$=0 V or 5 V.

What is claimed is:

1. A non-volatile semiconductor memory comprising:
   a memory cell array having non-volatile memory cells disposed in a matrix form, each said memory cell having a floating gate, a control gate, an erase gate, a source and a drain, and data being written through injection of electrons into said floating gate and erased through removal of electrons from said floating gate; and
   a memory control circuit coupled to said memory cell array and being driven by a high voltage power source and a low voltage power source, predetermined voltages being applied by said memory control circuit to said control gate, said erase gate and said drain respectively of each said memory cell to enter one of a data write mode, a data erase mode and a data read mode, in said data write mode, high voltages being applied to said control gate and said drain of said memory cell to be data-written, a stress relaxing voltage being applied to each said erase gate of said memory cells not to be data-written, and said stress relaxing voltage being an intermediate voltage between the voltages of said high and low voltage power sources,
   wherein said memory control circuit includes voltage outputting means for outputting said stress relaxing voltage,
   wherein said voltage outputting means includes:
      a block decoder for receiving control signals and outputting a signal to an output terminal, said output signal taking a first level in said data write mode and said data erase mode and a second level in said data read mode;

a voltage booster circuit connected to said output terminal of said block decoder, said voltage booster circuit being inputted with a booster circuit drive control signal, said booster circuit drive control signal taking said first level in said data erase mode and taking said second level in said data write mode and data read mode, said voltage booster circuit entering in an operation state when said voltage booster circuit drive control signal takes said first level, to output an erase high voltage to a final output terminal of said voltage outputting means, and said voltage booster circuit entering an inactive operation state when said voltage booster circuit drive control signal takes said second level, to disconnect said voltage booster circuit from said final output terminal;

a voltage buffer circuit connected between an output terminal of said voltage booster circuit and an output terminal of said block decoder, for preventing said erase high voltage outputted from said voltage booster circuit from being applied directly to said block decoder, and outputting said stress relaxing voltage to said final output terminal when said block decoder outputs said output signal of said first level, and outputting a voltage of said low voltage power source to said final output terminal when said block decoder outputs said output signal of said second level; and a feedback circuit connected between said block decoder and said voltage buffer circuit, said feedback circuit regulating a potential at the connection node between said block decoder and said voltage buffer circuit to have a predetermined potential value, by lowering said potential through discharge when said potential rises over said predetermined potential value and by raising said potential through charge from said block decoder when said potential lowers below said predetermined potential value.

2. A non-volatile semiconductor memory according to claim 1, wherein said feedback circuit includes switching means connected between said connection node and a ground power source, said switching means turning on when said potential at said connection node rises over said predetermined potential value and turning off when said potential lowers below said predetermined potential value.

3. A non-volatile semiconductor memory according to claim 2, wherein said feedback circuit is applied with a constant control voltage from a constant voltage circuit, said constant control voltage determining said potential at said connection node.

4. A non-volatile semiconductor memory, comprising:

a memory cell array having non-volatile memory cells disposed in a matrix form, each said memory cell having a floating gate, a control gate, an erase gate, a source and a drain, and data being written through injection of electrons into said floating gate and erased through removal of electrons from said floating gate; and a memory control circuit coupled to said memory cell array and being driven by a high voltage power source and a low voltage power source, predetermined voltages being applied by said memory control circuit to said control gate, said erase gate and said drain respectively of each said memory cell to enter one of a data write mode, a data erase mode and a data read mode, in said data write mode, high voltages being applied to said control gate and said drain of said memory cell to be data-written, a stress relaxing voltage being applied to each said erase gate of said memory cells not to be data-written, and said stress relaxing voltage being an intermediate voltage between the voltages of said high and low voltage power sources, wherein said stress relaxing voltage reduces a voltage stress causing a possible write error/erase error of each said memory cell not to be data-written, wherein said memory control circuit includes voltage outputting means for outputting said stress relaxing voltage, wherein said voltage outputting means includes:

a block decoder for receiving control signals and outputting a signal from an output terminal, said output signal taking a first level in said data write mode and said data erase mode and a second level in said data read mode;

a voltage booster circuit connected to said output terminal of said block decoder, said voltage booster circuit being inputted with a booster circuit drive control signal, said booster circuit drive control signal taking said first level in said data erase mode and taking said second level in said data write mode and data read mode, said voltage booster circuit entering in an operation state when said voltage booster circuit drive control signal takes said first level, to output an erase high voltage from a final output terminal of said voltage outputting means, and said voltage booster circuit entering an inactive operation state when said voltage booster circuit drive control signal takes said second level, to disconnect said voltage booster circuit from said final output terminal;

a voltage buffer circuit connected between an output terminal of said voltage booster circuit and an output terminal of said block decoder, for preventing said erase high voltage outputted from said voltage booster circuit from being applied directly to said block decoder, and outputting said stress relaxing voltage to said final output terminal when said block decoder outputs said output signal of said first level, and outputting a voltage of said low voltage power source to said final output terminal when said block decoder outputs said output signal of said second level, and a feed back circuit connected between said block decoder and said voltage buffer circuit, said feed back circuit regulating a potential at the connection node between said block decoder and said voltage buffer circuit to have a predetermined potential value, by lowering said potential through discharge when said potential rises over said predetermined potential value and by raising said potential through charge from said block decoder when said potential lowers below said predetermined potential value.

5. A non-volatile semiconductor memory according to claim 4, wherein said feedback circuit includes switching means connected between said connection node and a ground power source, said switching means turning on when said potential at said connection node rises over said predetermined potential value and turning off when said potential lowers below said predetermined potential value.

6. A non-volatile semiconductor memory according to claim 5, wherein said feedback circuit is applied with a constant control voltage from a constant voltage circuit, said constant control voltage determining said potential at said connection node.

7. A non-volatile semiconductor memory, comprising:

a memory cell array having non-volatile memory cells disposed in a matrix form, each said memory cell having a floating gate, a control gate, an erase gate, a source and a drain, and data being written through injection of electrons into said floating gate and erased through removal of electrons from said floating gate; and a memory control circuit coupled to said memory cell array and being driven by a high voltage power source and a low voltage power source, predetermined voltages being applied by said memory control circuit to said control gate, said erase gate and said drain respectively of each said memory cell to enter one of a data write mode, a data erase mode and a data read mode, in said data write mode, high voltages being applied to said control gate and said drain of said memory cell to be data-written, a stress relaxing voltage being applied to each said erase gate of said memory cells not to be data-written, and said stress relaxing voltage being an intermediate voltage between the voltages of said high and low voltage power sources, wherein said stress relaxing voltage reduces a voltage stress causing a possible write error/erase error of each said memory cell not to be data-written, wherein said stress relaxing voltage is generated independently from said high and low voltage power sources, wherein said memory control circuit includes voltage outputting means for outputting said stress relaxing voltage, wherein said voltage outputting means includes:

a block decoder for receiving control signals outputting a signal from an output terminal, said output signal taking a first level in said data write mode and said data erase mode and a second level in said data read mode;

a voltage booster circuit connected to said output terminal of said block decoder, said voltage booster circuit being inputted with a booster circuit drive control signal, said booster circuit drive control signal taking said first level in said data erase mode and taking said second level in said data write mode and data read mode, said voltage booster circuit entering in an operation state when said voltage booster circuit drive control signal takes said first level, to output an erase high voltage from a final output terminal of said voltage outputting means, and said voltage booster circuit entering an inactive operation state when said voltage booster circuit drive control signal takes said second level, to disconnect said voltage booster circuit from said final output terminal;

a voltage buffer circuit connected between an output terminal of said voltage booster circuit and an output terminal of said block decoder, for preventing said erase high voltage outputted from said voltage booster circuit from being applied directly to said block decoder, and outputting said stress relaxing voltage to said final output terminal when said block decoder outputs said output signal of said first level, and outputting a voltage of said low voltage power source to said final output terminal when said block decoder outputs said output signal of said second level, and a feedback circuit connected between said block decoder and said voltage buffer circuit, said feedback circuit regulating a potential at the connection node between said block decoder and said voltage buffer circuit to have a predetermined potential value, by lowering said potential through discharge when said potential rises over said predetermined potential value and by raising said potential through charge from said block decoder when said potential lowers below said predetermined potential value.

8. A non-volatile semiconductor memory according to claim 7, wherein said feedback circuit includes switching means connected between said connection node and a ground power source, said switching means turning on when said potential at said connection node rises over said predetermined potential value and turning off when said potential lowers below said predetermined potential value.

9. A non-volatile semiconductor memory according to claim 8, wherein said feedback circuit is applied with a constant control voltage from a constant voltage circuit, said constant control voltage determining said potential at said connection node.

* * * * *